(12) United States Patent
Cho

(10) Patent No.: US 8,455,307 B2
(45) Date of Patent: Jun. 4, 2013

(54) FINFET INTEGRATED CIRCUITS AND METHODS FOR THEIR FABRICATION

(75) Inventor: Jin Cho, Palo Alto, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 70 days.

(21) Appl. No.: 13/111,741

(22) Filed: May 19, 2011

(65) Prior Publication Data

US 2012/0292672 A1    Nov. 22, 2012

(51) Int. Cl.
  *H01L 21/311* (2006.01)
  *H01L 21/335* (2006.01)
  *H01L 23/44* (2006.01)
  *H01L 29/76* (2006.01)

(52) U.S. Cl.
  USPC ........... 438/142; 438/700; 257/288; 257/722; 257/E27.148; 257/E29.13

(58) Field of Classification Search
  CPC .. H01L 21/31144; H01L 29/785; H01L 29/517
  USPC ................... 257/288, E27.148, E29.13, 722, 257/713, 499; 438/142, 696, 700
  See application file for complete search history.

(56) References Cited

U.S. PATENT DOCUMENTS

2005/0227424 A1 * 10/2005 Oh et al. ........................ 438/197
2010/0015778 A1    1/2010 Lin et al.

* cited by examiner

*Primary Examiner* — Nikolay Yushin
(74) *Attorney, Agent, or Firm* — Ingrassia Fisher & Lorenz, P.C.

(57) ABSTRACT

FINFET ICs and methods for their fabrication are provided. In accordance with one embodiment a FINFET IC is fabricated by forming in a substrate a region doped with an impurity of a first doping type. The substrate region is etched to form a recess defining a fin having a height and sidewalls and the recess adjacent the fin is filled with an insulator having a thickness less than the height. Spacers are formed on the sidewalls and a portion of the insulator is etched to expose a portion of the sidewalls. The exposed portion of the sidewalls is doped with an impurity of the first doping type, the exposed sidewalls are oxidized, and the sidewall spacers are removed. A gate insulator and gate electrode are formed overlying the fin, and end portions of the fin are doped with an impurity of a second doping type to form source and drain regions.

20 Claims, 4 Drawing Sheets

US 8,455,307 B2

FINFET INTEGRATED CIRCUITS AND METHODS FOR THEIR FABRICATION

TECHNICAL FIELD

The present invention generally relates to FINFET integrated circuits and to methods for their manufacture, and more particularly relates to FINFET integrated circuits without parasitic conduction paths and to methods for fabricating such circuits.

BACKGROUND

Transistors such as metal oxide semiconductor field effect transistors (MOSFETs) or simply field effect transistors (FETs) are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FINFET is a type of transistor that lends itself to the dual goals of reducing transistor size while maintaining transistor performance. The FINFET is a three dimensional transistor formed in a thin fin that extends upwardly from a semiconductor substrate. Transistor performance, often measured by its transconductance, is proportional to the width of the transistor channel. In a FINFET the transistor channel is formed along the vertical sidewalls of the fin, so a wide channel, and hence high performance, can be achieved without substantially increasing the area of the substrate surface required by the transistor.

FINFET ICs have traditionally been fabricated using semiconductor on insulator (SOI) substrates. There are significant advantages, however, to fabricating FINFET ICs on a bulk semiconductor substrate, including the significantly lower cost and higher crystalline quality of a bulk semiconductor substrate compared to a SOI substrate. Some problems that are easily solved when using SOI substrates must be addressed when fabricating FINFET ICs on a bulk semiconductor substrate. When using a SOI substrate, isolation between fins is achieved by etching away all of the semiconductor material between the fins, leaving the fins extending upwardly from the underlying insulating material. In addition, with an SOI substrate all current flow between source and drain regions is controlled by the gate electrode because there is no parasitic conduction path through an underlying semiconductor substrate. The issue of isolation between fins in a FINFET IC fabricated on a bulk semiconductor substrate is addressed in Patent Application Publication US2010/0015778, assigned to Advanced Micro Devices, Inc. That Application does not address, however, the parasitic conduction path that exists between source and drain through the underlying semiconductor substrate and under the gate controlled channel in a conventional FINFET fabricated on a bulk semiconductor substrate.

Accordingly, it is desirable to provide a bulk FINFET IC that overcomes the problem of parasitic conduction between transistor source and drain. In addition, it is desirable to provide methods for fabricating a FINFET IC on a bulk semiconductor substrate that eliminate parasitic conduction paths between transistor source and drain regions. Furthermore, other desirable features and characteristics of the present invention will become apparent from the subsequent detailed description and the appended claims, taken in conjunction with the accompanying drawings and the foregoing technical field and background.

BRIEF SUMMARY

Methods for fabricating FINFET integrated circuits (ICs) are provided. In accordance with one embodiment a FINFET IC is fabricated by forming in a substrate a region doped with an impurity of a first doping type. The substrate region is etched to form a recess defining a fin having a height and sidewalls, and the recess adjacent the fin is filled with an insulator having a thickness less than the height. Spacers are formed on the sidewalls, and a portion of the insulator is etched to expose a portion of the sidewalls. The exposed portion of the sidewalls is doped with an impurity of the first doping type, the exposed sidewalls are oxidized, and the sidewall spacers are removed. A gate insulator and gate electrode are formed overlying the fin, and end portions of the fin are doped with an impurity of a second doping type to form source and drain regions.

In accordance with another embodiment a FINFET IC is fabricated by forming a plurality of fins extending from a semiconductor substrate, each of the fins having a first doping concentration of a first dopant type. An oxide is deposited to partially fill between adjacent ones of the plurality of fins. A layer of the fins above the oxide is doped with a dopant of the first dopant type and a second doping concentration greater than the first doping concentration. A gate insulator and gate electrode are formed overlying at least one of the plurality of fins, and end portions of the at least one of the plurality of fins is doped with an impurity of a second doping type to form source and drain regions.

In accordance with yet another embodiment a FINFET integrated circuit is provided that includes a fin extending from a semiconductor substrate and having a first portion adjacent the semiconductor substrate and a second portion spaced apart from the semiconductor substrate, the second portion having a first doping concentration of a first conductivity dopant type. End portions of the fin are doped with impurities of a second conductivity dopant type to form source and drain regions, and a gate electrode overlies the fin between the end portions. A region of the fin underlying the gate electrode and positioned between the first portion and the second portion has a second doping concentration greater than the first doping concentration of the first conductivity dopant type.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. The use of "up" or "upwardly" are intended only to imply reference to the surface of a semiconductor substrate.

Figure 1:
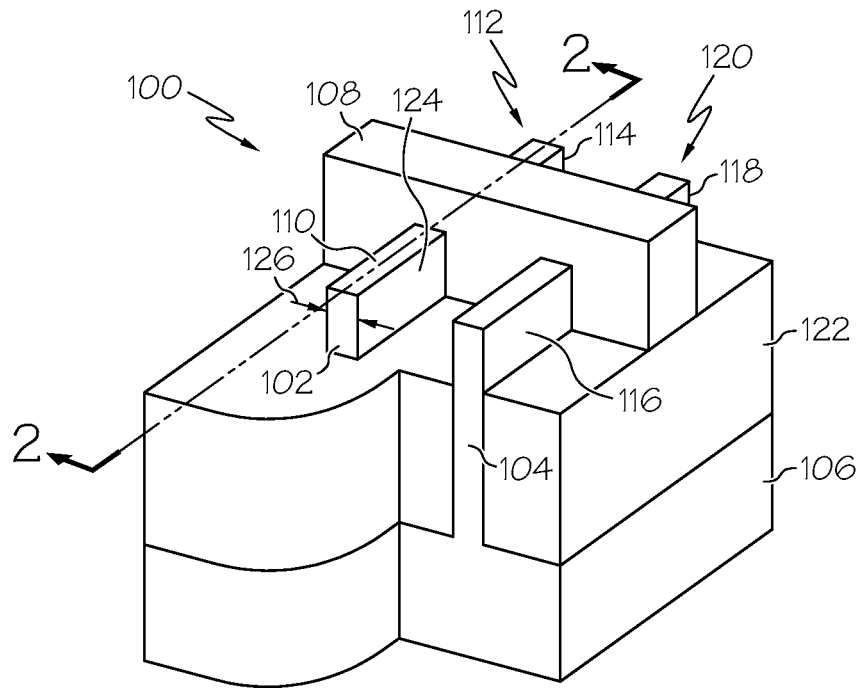
FIG. 1 illustrates, in a cut away perspective view, a portion of a prior art FINFET integrated circuit.

FIG. 1 illustrates, in a cut away perspective view, a portion of a prior art FINFET integrated circuit (IC) 100. The illustrated portion of IC 100 includes two fins 102 and 104 that are formed from and extend upwardly from a bulk semiconductor substrate 106. A gate electrode 108 overlies the two fins and is electrically insulated from the fins by a gate insulator (not illustrated). End 110 of fin 102 is appropriately impurity doped to form the source of a field effect transistor 112 and end 114 of that fin is appropriately impurity doped to form the drain of the FET. Similarly, ends 116 and 118 of fin 104 form the source and drain, respectively, of another FET 120. The illustrated portion of IC 100 thus includes two FETs 112 and 120 having a common gate electrode. In another configuration, if source 110 and 116 are electrically coupled together and drains 114 and 118 are electrically coupled together the structure would be a two-fin FINFET having twice the gate width of either FET 112 or 120. Oxide layer 122 forms electrical isolation between fins and between adjacent devices as is needed for the circuit being implemented. The channel of FINFET 112 extends along the sidewall 124 of fin 102 beneath gate electrode 108 as well as along the opposite sidewall not visible in this perspective view. The advantage of the FINFET structure is that although the fin has only the narrow width represented by the arrows 126, the channel has a width represented by at least twice the height of the fin above oxide 122. The channel width thus can be much greater than fin width.

Figure 2:
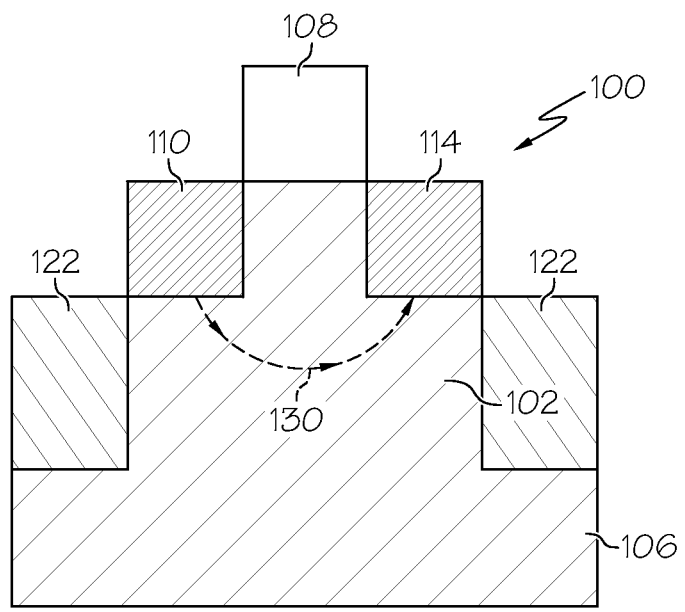
FIG. 2 illustrates, in cross section, a portion of the FINFET integrated circuit of FIG. 1.

FIG. 2 is a cross sectional view through fin 102 along the line 2-2 and serves to illustrate a problem with prior art bulk FINFET integrated circuits. Even if the impurity doping forming source region 110 and drain region 114 is limited to the portion of fin 102 that is indicated by cross hatching, a parasitic conduction path exists through the fin as indicated by dashed arrow 130. This conduction path is below gate electrode 108 and is not controlled by bias on the gate electrode. The conduction path can be "shut off" by increasing the doping in fin 102, but such increase in doping would increase the threshold voltage of the device and would degrade transistor performance.

Figure 8:
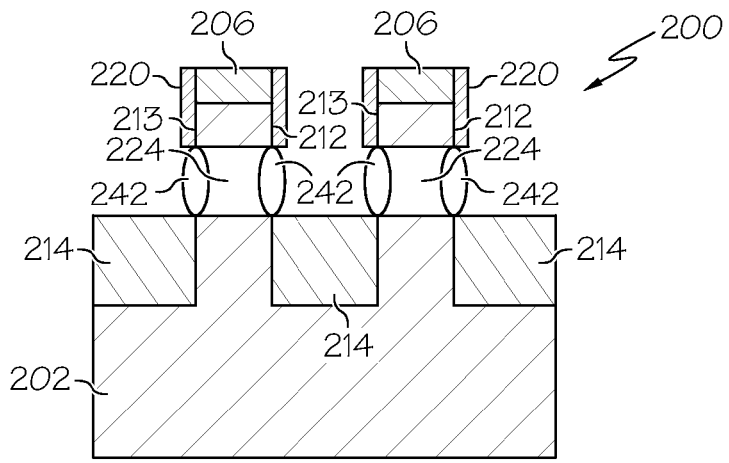
Figure 9:
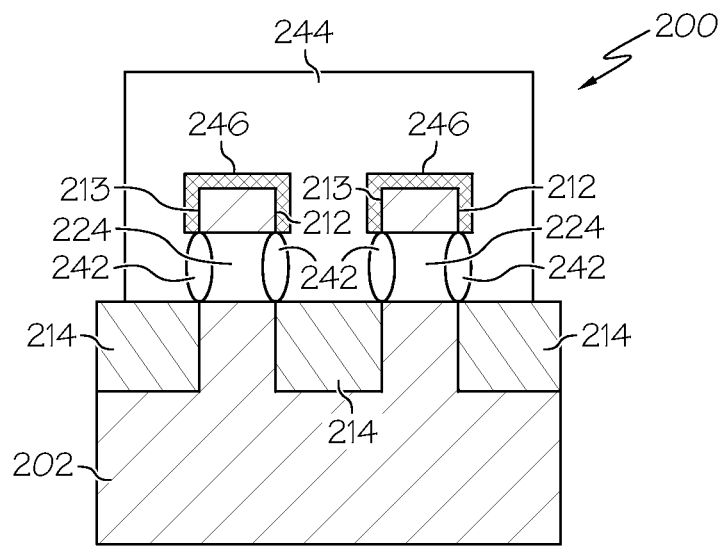
Figure 10:
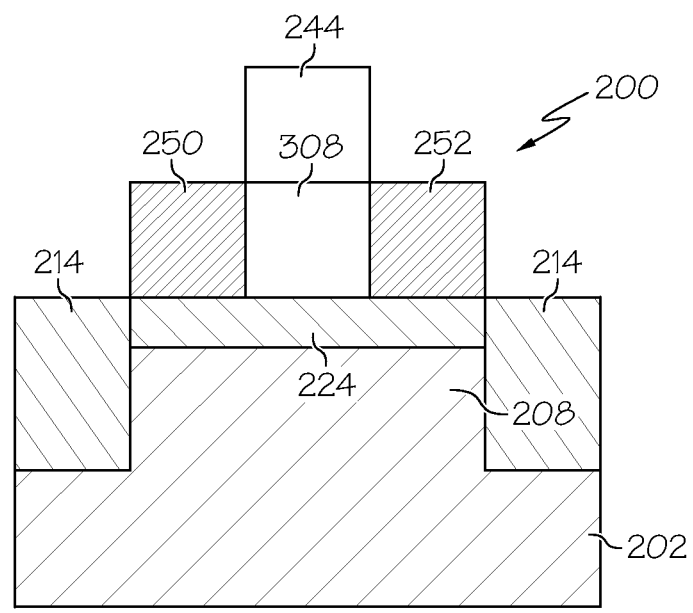

FIGS. 3-10 illustrate a FINFET IC 200 and methods for its fabrication, in accordance with various embodiments, that avoid the previously described problem of parasitic conduction without degrading the performance of the IC. FIGS. 3-9 are cross sectional views perpendicular to a plurality of fin structures. FIG. 10 is a cross sectional view perpendicular to a gate electrode overlying a fin structure. Only a portion of the FINFET IC is illustrated. Various steps in the manufacture of ICs are well known to those of skill in the art and so, in the interest of brevity, many conventional steps will only be mentioned briefly herein or will be omitted entirely without providing the well known process details.

Figure 3:
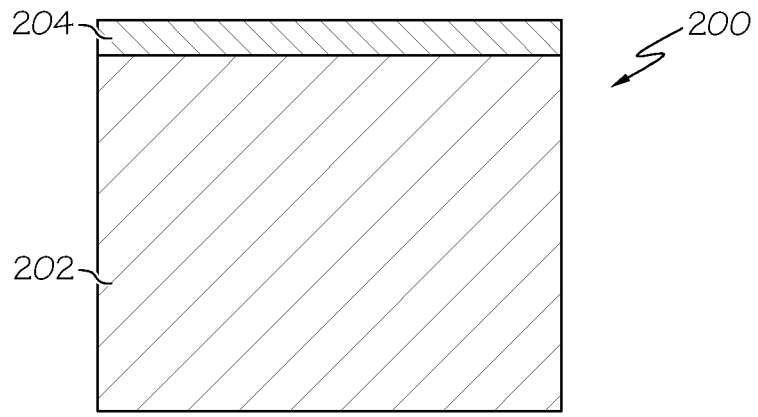
FIGS. 3-10 illustrate, in cross sectional views, a portion of a FINFET integrated circuit and methods for its fabrication in accordance with exemplary embodiments.

As illustrated in cross section in FIG. 3, the method in accordance with one embodiment begins by providing a bulk semiconductor substrate 202. Semiconductor substrate 202 can be, for example a monocrystalline wafer of silicon, silicon admixed with germanium, or other semiconductor material commonly used in the semiconductor industry for the fabrication of semiconductor integrated circuits. At least a well region of semiconductor substrate is doped with conductivity determining impurities. If the FINFET IC being fabricated is a CMOS IC, there will be at least one well region of the semiconductor substrate that is impurity doped with N-type impurities and at least one well region doped with P-type impurities. The region, either N-type or P-type, can be doped, for example, by ion implantation. Multiple ion implantation steps may be used to achieve the desired dopant concentration and profile. The dopant profile is determined to establish, among other concerns, the desired threshold voltage for the device being fabricated. A layer of silicon nitride 204 or other hard mask material is deposited overlying the surface of the semiconductor substrate. The hard mask material can be deposited by chemical vapor deposition (CVD), low pressure chemical vapor deposition (LPCVD), plasma enhanced chemical vapor deposition (PECVD), or the like.

Figure 4:
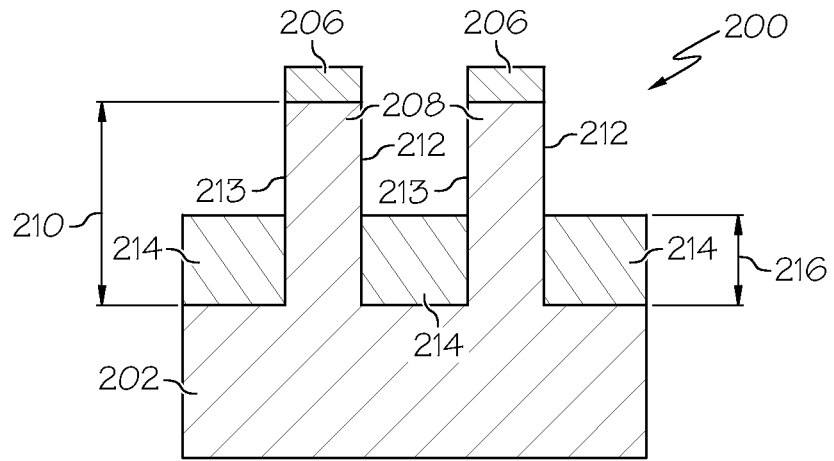

The method in accordance with one embodiment continues as illustrated in FIG. 4. The layer of silicon nitride 204 or other hard mask material is patterned to form an etch mask 206 overlying the intended locations of a plurality of fins. The semiconductor substrate exposed by the etch mask is anisotropically etched to form a plurality of fins 208, only two of which are illustrated. The semiconductor substrate can be etched, for example by reactive ion etching (RIE) using any of the common semiconductor etchants. Fins 208 have the same impurity doping type and concentration as the semiconductor region from which they were etched. The fins are also characterized by the height by which they extend above the surface of the remaining semiconductor substrate, indicated by double headed arrow 210, and by opposing sidewalls 212 and 213. The region adjacent to and between adjacent ones of the plurality of fins is partially filled with an insulator 214. The insulator can be, for example, an oxide layer blanket deposited from a TEOS source using LPCVD or a high density plasma (HDP) process to cover the fins and to completely fill the region between the fins. The deposited oxide can be planarized, for example by chemical mechanical planarization (CMP), and then etched to the desired height. The resulting thickness of insulator 214, indicated by double headed arrow 216, is less than the height of fins 208.

Figure 5:
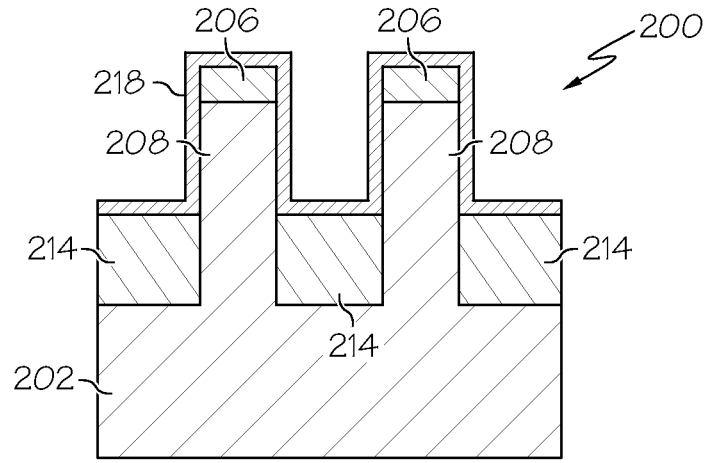

As illustrated in FIG. 5, the method in accordance with one embodiment continues by depositing a layer of spacer forming material 218 overlying the plurality of fins 208, etch mask 206, and insulator 214. The spacer forming material can be, for example, silicon nitride or other material different than insulator 214 conformally deposited by LPCVD.

Figure 6:
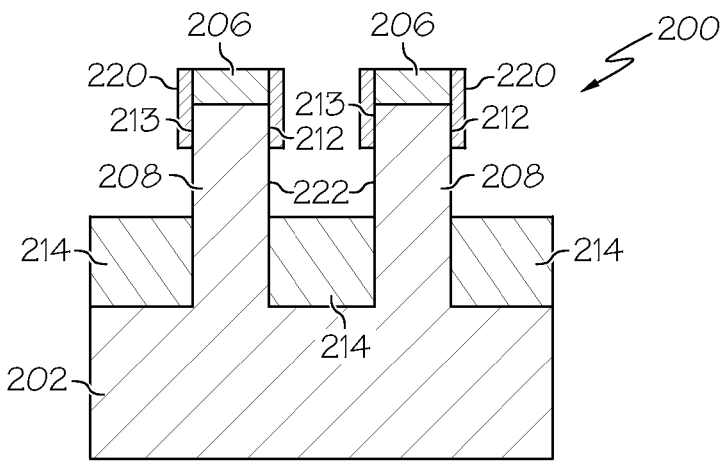

The layer of spacer forming material is anisotropically etched, for example by RIE, to form sidewall spacers 220 on sidewalls 212 and 213 of fins 208. After forming sidewall spacers 220, insulator 214 is etched to reduce its thickness, to cause the remaining thickness of insulator to be spaced apart from the sidewall spacers, and to expose a portion 222 of sidewalls 212 and 213 above the upper surface of insulator 214 as illustrated in FIG. 6.

Figure 7:
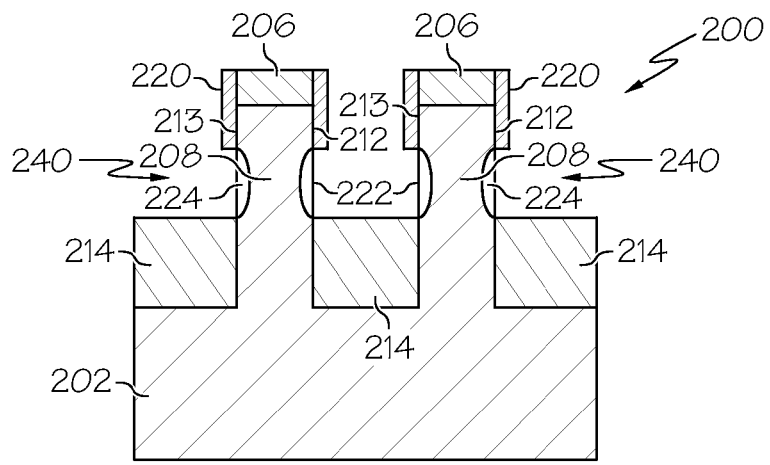

In accordance with one embodiment, the method for fabricating a FINFET IC continues as illustrated in FIG. 7 by impurity doping the exposed portions 222 of sidewalls 212 and 213 with conductivity determining dopant impurities of the same conductivity type as the conductivity type in the associated well region of semiconductor substrate 202 to form a heavily doped region 224. For example, if the portion of the IC being illustrated is an N-channel FET, the substrate region and fins 208 would be doped with P-type impurity dopants. Heavily doped region 224 is also doped with P-type dopant impurities and is doped to an impurity dopant concentration greater than the impurity dopant concentration in the upper portion of fin. The heavily doped region can be impurity doped, for example, by plasma doping; that is, by subjecting exposed portions 222 to a plasma environment rich in impurity dopant ions to implant such ions into the exposed portions as illustrated by arrows 240. During the plasma doping, sidewall spacers 220 serve as a dopant mask protecting the upper portion of the fin from the plasma doping environment. The IC being fabricated may also be heated, for example by rapid thermal annealing (RTA), to thermally diffuse the plasma implanted ions.

As illustrated in FIG. 8, in accordance with one embodiment, heavily doped regions 224 are diffused sufficiently to cause the heavily doped regions to extend from sidewall 212 to sidewall 213. That is, the heavily doped regions extend completely across the thickness of the fin. As also illustrated in FIG. 8, the method continues by oxidizing the exposed sidewalls to form an oxide 242 overlying the heavily doped regions. Oxide 242 can be formed, for example, if the semiconductor substrate contains silicon, by thermally oxidizing the silicon in an oxidizing ambient to form a layer of silicon dioxide. Oxide 242 can have a thickness, for example, exceeding a few tens of nanometers. After forming oxide 242, sidewall spacers 220 and any remaining portion of hard mask 204 are removed.

The method continues by forming a gate insulating layer (not illustrated) and a gate electrode 244 overlying the fins as illustrated in FIG. 9. The gate insulator can be silicon oxide, nitrided silicon oxide, a high dielectric constant insulator, combinations of such insulators, and the like. The gate insulator is typically less than 10 nanometers in thickness. Gate electrode 244 can be polycrystalline or amorphous silicon, metal, other conductive materials, or combinations of such materials. The gate insulator and gate electrode materials are selected based on the circuit being implemented and the requirements of the particular transistor being utilized in that circuit. The material selected for the gate electrode is blanket deposited and lithographically patterned. Bias applied to gate electrode 244 will control the flow of current through a channel 246 formed on the surface of fins 208 with the current flowing perpendicular to the plane of the page in this view. Unwanted parasitic current flowing from source to drain, that is, current that is not controlled by the bias on the gate electrode, is reduced by the increased impurity doping in heavily doped region 224 and relatively thick (in comparison to the gate insulator) oxide layer 242. Both the increased impurity doping and the relatively thick oxide increase the threshold voltage of any parasitic transistor that may be formed.

FIG. 10 illustrates a portion of FINFET IC 200 in cross section, with the cross section taken through one of the plurality of fins 208 and perpendicular to gate electrode 244 overlying the fin. Following the patterning of gate electrode 244 the end portions of fins 208 that are not covered by the gate electrode are impurity doped with a conductivity determining dopant of opposite doping type compared to the doping type of semiconductor substrate region 202. For example, if the FINFET being illustrated is an N-channel FET, the end portions are doped with N-type conductivity determining impurities to form a source region 250 and a drain region 252. The N-type source and drain regions can be doped, for example, by implanting arsenic or phosphorous ions. If the gate electrode is silicon, the gate electrode also can be doped by the ion implantation. As also illustrated in FIG. 10, heavily doped region 224 underlies the source and drain regions and underlies portion 308 of fin 208 in which the transistor channel is formed during device operation. As explained above, the heavily doped region 224 and relatively thick oxide 242 (not seen in this view) serve to block any parasitic channel extending between source region 250 and drain region 252. The impurity doping concentration in portion 308 is established based on the desired characteristics of the device being implemented and is independent of the doping concentration in heavily doped region 224. The upper portion of fin 208 has a doping concentration based on desired device characteristics; the heavily doped region of the fin, located below that upper portion, has a doping concentration determined to block parasitic current flow between the source and drain of the FINFET.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating a FINFET integrated circuit comprising:
    forming in a substrate a region doped with an impurity of a first doping type;
    etching a recess into the substrate region to define a fin having a height and first and second sidewalls;
    partially filling the recess adjacent the fin with an insulator having a thickness less than the height;
    forming spacers on the sidewalls;
    etching a portion of the insulator to expose a portion of the sidewalls;
    doping the exposed portion of the sidewalls with an impurity of the first doping type;
    oxidizing the exposed sidewalls;
    removing the sidewall spacers;
    forming a gate insulator and a gate electrode overlying the fin; and
    impurity doping end portions of the fin with an impurity of a second doping type to form source and drain regions.

2. The method of claim 1 wherein etching a recess into the substrate region to define a fin comprises:
    forming a silicon nitride etch mask overlying the substrate region; and
    anisotropically etching the substrate region exposed by the silicon nitride etch mask.

3. The method of claim 2 wherein forming spacers comprises:
    depositing a layer of spacer forming material overlying the silicon nitride etch mask and the fin; and
    anisotropically etching the layer of spacer forming material.

4. The method of claim 1 wherein forming a gate insulator and gate electrode comprises:
    forming a layer of gate insulator overlying the fin;
    depositing a layer of silicon overlying the layer of gate insulator; and
    lithographically patterning the layer of silicon.

5. The method of claim 4 wherein impurity doping end portions of the fin comprises ion implanting the end portions with conductivity determining ions and further comprises ion implanting the layer of silicon.

6. The method of claim 1 wherein doping the exposed portion of the sidewalls comprises impurity doping in a plasma environment.

7. The method of claim 6 wherein forming in a substrate a region doped with an impurity of a first doping type comprises impurity doping the region to a first doping concentration and wherein doping the exposed portion of the sidewalls comprises impurity doping to a second doping concentration greater than the first doping concentration.

8. The method of claim 7 wherein doping the exposed portion of the sidewalls comprises forming an impurity doped layer extending between first and second sidewalls.

9. The method of claim 8 wherein oxidizing the exposed sidewalls comprises growing an oxide overlying the impurity doped layer.

10. A method for fabricating a FINFET integrated circuit comprising:
   forming a plurality of fins extending from a semiconductor substrate, each of the fins having a first doping concentration of a first dopant type;
   depositing an oxide to partially fill between adjacent ones of the plurality of fins;
   doping a layer of the fins above the oxide with a dopant of the first dopant type and a second doping concentration greater than the first doping concentration, wherein doping a layer comprises exposing the plurality of fins to a plasma comprising impurity dopant ions;
   forming a gate insulator and gate electrode overlying at least one of the plurality of fins; and
   doping end portions of the at least one of the plurality of fins with an impurity of a second doping type to form source and drain regions.

11. The method of claim 10 wherein forming a gate insulator and gate electrode comprises:
   forming a layer of gate insulator material; and
   depositing a layer of polycrystalline silicon.

12. The method of claim 10 further comprising forming a dopant mask overlying an upper portion of each of the plurality of fins, the dopant mask spaced apart from the oxide.

13. The method of claim 12 wherein forming a dopant mask spaced apart from the oxide comprises:
   forming a dopant mask overlying an upper portion of each of the plurality of fins; and
   etching the oxide to form a space between the oxide and the dopant mask.

14. The method of claim 12 wherein forming a dopant mask comprises:
   depositing a layer of spacer forming material overlying the plurality of fins; and
   anisotropically etching the layer of spacer forming material.

15. The method of claim 10 wherein each of the plurality of fins has first and second sidewalls and wherein doping a layer comprises doping with a dopant of the first dopant type and a second doping concentration greater than the first doping concentration to form an impurity doped layer extending from the first sidewall to the second sidewall.

16. The method of claim 15 further comprising forming an oxide layer overlying the doped layer.

17. The method of claim 10 wherein forming a plurality of fins comprises:
   depositing an etch mask material overlying the semiconductor substrate;
   patterning the etch mask material to form an etch mask; and
   anisotropically etching the semiconductor substrate.

18. The method of claim 17 further comprising:
   depositing a layer of sidewall spacer material overlying the etch mask and the plurality of fins; and
   anisotropically etching the layer of sidewall spacer material to form a dopant mask.

19. A FINFET integrated circuit comprising:
   a fin extending from a semiconductor substrate and having a first portion adjacent the semiconductor substrate and a second portion spaced apart from the semiconductor substrate;
   the second portion having a first doping concentration of a first conductivity dopant type;
   end portions of the fin doped with impurities of a second conductivity dopant type;
   a gate electrode overlying the fin between the end portions; and
   a region of the fin underlying the gate electrode and positioned between the first portion and the second portion having a second doping concentration greater than the first doping concentration of the first conductivity dopant type, wherein the region positioned between the first portion and the second portion comprises an oxide formed on sidewalls of the region, and wherein the oxide is not formed on a sidewall of either the first portion or the second portion.

20. The FINFET integrated circuit of claim 19, wherein the oxide formed on the sidewalls of the region between the first portion and the second portion is a thermally-formed oxide.

* * * * *